(12) United States Patent
Pullmann et al.

(10) Patent No.: US 10,460,895 B2
(45) Date of Patent: Oct. 29, 2019

(54) SAFETY SWITCHING DEVICE FOR FAIL-SAFELY DISCONNECTING AN ELECTRICAL LOAD

(71) Applicant: PILZ GMBH & CO. KG, Ostfildern (DE)

(72) Inventors: Jürgen Pullmann, Ostfildern (DE); Roland Rupp, Ostfildern (DE); Christoph Zinser, Ostfildern (DE); Antonio Spataro, Bad Ragaz (CH); Marco Giger, Bad Ragaz (CH); Hans Schwenkel, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 5 days.

(21) Appl. No.: 15/708,343

(22) Filed: Sep. 19, 2017

(65) Prior Publication Data

US 2018/0005788 A1 Jan. 4, 2018

Related U.S. Application Data

(63) Continuation of application No. PCT/EP2016/055988, filed on Mar. 18, 2016.

(30) Foreign Application Priority Data

Mar. 20, 2015 (DE) .................. 10 2015 104 211

(51) Int. Cl.
*H01H 47/00* (2006.01)
*G05B 9/03* (2006.01)
(Continued)

(52) U.S. Cl.
CPC ............. *H01H 47/005* (2013.01); *G05B 9/03* (2013.01); *H01H 47/22* (2013.01); *H01H 50/54* (2013.01);
(Continued)

(58) Field of Classification Search
CPC ...... H01H 47/005; H01H 47/22; H01H 50/54; G05B 9/03; H02H 3/20; H02H 1/007
(Continued)

(56) References Cited

U.S. PATENT DOCUMENTS

| 4,682,133 A | 7/1987 | Kern |
| 4,833,435 A | 5/1989 | Ohara |

(Continued)

FOREIGN PATENT DOCUMENTS

| CN | 101305287 A | 11/2008 |
| CN | 101578678 A | 11/2009 |

(Continued)

OTHER PUBLICATIONS

English language translation of International Preliminary Report on Patentability (Chapter I) for PCT/EP2016/055988; dated Oct. 5, 2017; 7 pp.

(Continued)

*Primary Examiner* — Dinh T Le
(74) *Attorney, Agent, or Firm* — Harness, Dickey & Pierce, P.L.C.

(57) ABSTRACT

A safety switching device for fail-safely disconnecting an electrical load has an input part for receiving a safety-relevant input signal, a logic part for processing the at least one safety-relevant input signal, and an output part. The output part has a relay coil and four relay contacts. The first and second relay contacts are arranged electrically in series with one another. The third and fourth relay contacts are also arranged electrically in series with one another. The first and the third relay contacts are mechanically coupled to each other and form a first group of positively driven relay contacts. The second and the fourth relay contacts are mechanically coupled to each other and form a second group of positively driven relay contacts. The logic part redun- (Continued)

dantly controls the first and the second groups of positively driven relay contacts to selectively allow, or to interrupt in a fail-safe manner, a current flow to the electrical load, depending on the safety-relevant input signal. The relay coil is electromagnetically coupled to the first and second groups of positively driven relay contacts so that the logic part can control the relay contacts together via a single relay coil.

15 Claims, 4 Drawing Sheets

(51) Int. Cl.
    *H03K 19/007*     (2006.01)
    *H01H 47/22*     (2006.01)
    *H01H 50/54*     (2006.01)
    *H02H 1/00*     (2006.01)
    *H02H 3/20*     (2006.01)

(52) U.S. Cl.
    CPC ............ *H02H 1/0007* (2013.01); *H02H 3/20* (2013.01); *H03K 19/0075* (2013.01); *H01H 47/002* (2013.01)

(58) Field of Classification Search
    USPC ......................................................... 307/326
    See application file for complete search history.

(56) References Cited

U.S. PATENT DOCUMENTS

| | | | |
|---|---|---|---|
| 6,160,323 | A | 12/2000 | Mayr et al. |
| 6,628,015 | B2 * | 9/2003 | Pullmann ................. F16P 3/00 307/326 |
| 7,187,091 | B2 | 3/2007 | Veil et al. |
| 7,623,326 | B2 | 11/2009 | Schwenkel et al. |
| 7,672,109 | B2 | 3/2010 | Nitsche et al. |
| 7,898,118 | B2 * | 3/2011 | Nitsche ................ H01H 47/005 307/326 |
| 2002/0011888 | A1 * | 1/2002 | Behrens ................ H01H 47/005 327/309 |
| 2008/0246344 | A1 * | 10/2008 | Pullmann ................. G01D 3/08 307/326 |
| 2009/0251835 | A1 | 10/2009 | Meinherz | 
| 2010/0302696 | A1 | 12/2010 | Yamada et al. |

FOREIGN PATENT DOCUMENTS

| | | |
|---|---|---|
| CN | 101640143 A | 2/2010 |
| CN | 101900790 A | 12/2010 |
| DE | 33 04 513 A1 | 8/1984 |
| DE | 35 30 266 A1 | 3/1987 |
| DE | 35 41 338 A1 | 5/1987 |
| DE | 37 05 918 A1 | 9/1988 |
| DE | 37 06 003 A1 | 9/1988 |
| DE | 37 07 491 A1 | 9/1988 |
| DE | 269 040 A1 | 6/1989 |
| DE | 42 01 577 A1 | 7/1993 |
| DE | 199 09 968 A1 | 9/1999 |
| DE | 100 22 722 A1 | 1/2002 |
| DE | 101 27 233 C1 | 11/2002 |
| DE | 10 2005014125 A1 | 9/2006 |
| DE | 102005048601 B3 | 4/2007 |
| DE | 102013101932 A1 | 8/2014 |
| EP | 0 211 446 A1 | 2/1987 |
| EP | 1 262 021 B1 | 1/2004 |
| EP | 2 662 874 A2 | 11/2013 |
| WO | WO-2012/116824 A1 | 9/2012 |

OTHER PUBLICATIONS

International Search Report for PCT/EP2016/055988; dated May 20, 2016; 3 pp.

Kirsch, Eberhard et al.; Sicherheitsrelaid—Elementarrelais mit zwangsgeführten Kontakten Besondere Eigenschaften und deren Nutzen ("Safety Relays—Elementary Relays Comprising Positively Driven Contacts; Particular Properties and Their Benefits"); exact date not known but prior to Mar. 20, 2015; 18 pp.

Von Europa in die Welt! Funktionale Sicherheit wird zum Leitgedanken ("From Europe Out Into the World! Functional Safety Becomes a Guiding Principle"); Nov. 2014; 6 pp.

CEI IEC 61508-2; Functional safety of electrical/electronic/programmable electronic safety-relared systems—Part 2: Requirements for electrical/electronic/progrmmable electronic safety-related systems; May 2000; 152 pp.

EN ISO 13849-1; Safety of machinery—Safety-related parts of control systems—Part 1: General principles for design (ISO 13849-1:2006); Nov. 2006; 97 pp.

* cited by examiner

SAFETY SWITCHING DEVICE FOR FAIL-SAFELY DISCONNECTING AN ELECTRICAL LOAD

CROSS-REFERENCES TO RELATED APPLICATIONS

This application is a continuation of international patent application PCT/EP2016/055988 filed on Mar. 18, 2016 designating the U.S., which international patent application has been published in German language and claims priority from German patent application DE 10 2015 104 211.8 filed on Mar. 20, 2015. The entire contents of these priority applications are incorporated herein by reference.

BACKGROUND OF THE INVENTION

The present invention relates to a safety switching device for fail-safely disconnecting an electrical load, and more particularly to a safety switching device employing a new type of safety relay having a plurality of mechanically coupled contacts.

Safety switching devices in terms of the present invention are typically used for fail-safely disconnecting an automated technical system which can pose a danger to life and limb of persons during operation. In this context, "fail-safe" means that disconnecting of the dangerous system must be ensured even when a fault occurs in the safety-relevant components of the system, including the safety switching device, for example due to a component failure or damage to a cable. Safety switching devices are therefore subject to particular requirements which are defined, in particular, in relevant standards for machine safety (ISO 13849, IEC 61508, inter alia). Since these standards define different requirements depending on the degree of risk, safety switching devices in terms of the present invention are to be, in the following, primarily such devices that ensure single fault safety within the meaning of SIL3 according to IEC 61508 and/or PL e according to ISO 13849 during the safe disconnecting of an electrically operated machine.

DE 10 2005 048 601 B3 discloses a prior art safety switching device comprising a logic part which includes two microcontrollers. The two microcontrollers can communicate with each other via a data link, in order to compare their data and monitor each other. The two microcontrollers process input signals that are redundant with respect to each other and that can originate, for example, from an emergency stop button, a guard door, or a light barrier. On the output side, each microcontroller controls an electromechanical safety relay comprising a plurality of mechanically coupled and, therefore, positively driven relay contacts. In each case, one normally open contact of one relay is connected in series to a normally open contact of the other relay, and so the redundantly operating microcontroller can disconnect a power supply path to an electrical machine in two ways, i.e., in a two-channel manner. In addition, each relay has a positively driven, normally closed contact which, due to the positive driven operation, is always open when the mechanically coupled, normally open contacts are closed. The normally closed contacts of the two safety relays are also arranged in series with one another and form a current path, via which a monitoring signal is fed back to the redundant microcontrollers. The microcontrollers can check the opened contact point of the normally open contacts on the basis of the monitoring signal, in order to detect, in particular, a bonding, fusing, or the like of the normally open contacts at an early point in time, before a dangerous electrical machine is switched on.

The use of two separate electromechanical safety relays, each of which has a plurality of mechanically coupled normally closed and normally open contacts, has been common practice—established for many years—for implementing safety switching devices in terms of the present invention, as described, for example, in a publication by the authors Eberhard Kirsch, Jürgen Steinhäuser, and Friedrich Plappert titled "Sicherheitsrelais—Elementarrelais mit zwangsgeführten Kontakten; Besondere Eigenschaften und deren Nutzen" (Safety Relays—Elementary Relays Comprising Positively Driven Contacts; Particular Properties and Their Benefits). This publication is made available by ZVEI—Zentralverband Elektrotechnik—und Elektronikindustrie e. V. (Germany's Electrical Industry), 60528 Frankfurt, under the www.schaltrelais.de/download/sicherheitsrelais.pdf and, as documented, was originally made available by the cited source in 2006.

A further overview of the use of safety relays for ensuring the so-called functional safety of automated systems is provided in the publication "Von Europa in die Welt! Funktionale Sicherheit wird zum Leitgedanken" ("From Europe Out Into the World! Functional Safety Becomes a Guiding Principle"), which was published in November 2014 by ZVEI and has also been made available under www.schaltrelais.de.

In addition, safety switching devices that utilize semiconductor switching elements instead of positively driven (electromagnetic) relays for the fail-safe disconnecting of an electrical load have been available for approximately 15 years. One example of such a safety switching device is disclosed by EP 1 262 021 B1. However, safety switching devices employing electromechanical safety relays have advantages for many applications, since, by way of example, they do not require a shared reference potential with the load to be disconnected, and they will therefore also be required in the future for numerous applications.

The use of two electromechanical safety relays, each of which comprises a plurality of normally open and normally closed contacts mechanically rigidly connected to each other, is a large cost factor in prior art safety switching devices having potential-free outputs. The costs for the safety relays make up a substantial portion of the total manufacturing costs for a safety switching device.

SUMMARY OF THE INVENTION

Against this background, it is an object of the present invention to provide a safety switching device of the type mentioned at the outset that makes it possible to reduce the manufacturing costs.

According to one aspect of the invention, there is provided a safety switching device for fail-safely disconnecting an electrical load, comprising an input part for receiving at least one safety-relevant input signal, comprising a logic part for processing the at least one safety-relevant input signal, and comprising an output part which comprises a relay coil and a first relay contact, a second relay contact, a third relay contact, and a fourth relay contact, wherein the first and the second relay contacts are arranged electrically in series with one another, wherein the third and the fourth relay contacts are arranged electrically in series with one another, wherein the first and the third relay contacts are mechanically coupled to each other so as to form a first group of positively driven relay contacts, wherein the second and the fourth relay contacts are mechanically coupled to each other so as to form a second group of positively driven relay contacts, wherein the first and the third relay contacts can move mechanically separately from the second and the fourth relay contacts, wherein the logic part redundantly controls the first group of positively driven relay contacts and the second group of positively driven relay contacts in order to selectively allow, or to interrupt in a fail-safe manner, a current flow to the electrical load, in response to the at least one safety-relevant input signal, and wherein the relay coil is electromagnetically coupled to the first group and to the second group of positively driven relay contacts in such a manner that the logic part can control the first relay contact, the second relay contact, the third relay contact, and the fourth relay contact together via a single relay coil.

According to another aspect of the invention, there is also provided a safety switching device relay component, comprising a relay coil, comprising a first relay contact, a second relay contact, a third relay contact, and a fourth relay contact, and comprising a component housing, in which the relay coil and the first relay contact, the second relay contact, the third relay contact and the fourth relay contact are accommodated, wherein the first and the second relay contacts are arranged electrically in series with one another, wherein the third and the fourth relay contacts are arranged electrically in series with one another, wherein the first and the third relay contacts are mechanically coupled to each other so as to form a first group of positively driven relay contacts, wherein the second and the fourth relay contacts are mechanically coupled to each other so as to form a second group of positively driven relay contacts, wherein the first and the third relay contacts can move mechanically separately from the second and the fourth relay contacts, and wherein the relay coil is electromagnetically coupled to the first group of positively driven relay contacts and to the second group of positively driven relay contacts in such a manner that a control current in the relay coil can control the first relay contact, the second relay contact, the third relay contact, and the fourth relay contact together.

The novel safety switching device therefore utilizes a novel electromagnetic relay arrangement, in which the redundant (arranged electrically in series with one another) contacts for the two-channel interruption of the current path to the electrical load are controlled with the aid of a shared magnetic field generated by means of a shared relay coil. A shared control current flows through the shared relay coil; the logic part can switch the shared control current on or off and/or can adjust the current level thereof. The logic part can therefore control the aforementioned relay contacts—at least in the preferred embodiments—using a single control current. Preferably, the shared control current flows completely through the single relay coil and generates the common magnetic field, with the aid of which all positively guided and redundant relay contacts can be actuated. The single relay coil comprises a winding assembly having two connections, preferably comprising precisely two electrical connections for supplying and conducting away the control current. In principle, however, one further connection on the relay coil is conceivable, for example, a center tap.

Surprisingly, it has been shown that it is possible to control two mechanically separate and separately movable contact groups, which are arranged electrically redundantly with respect to each other, with the aid of a shared magnetic field which is generated by means of a common coil shared by all relay contacts. In principle, it is possible to generate this shared magnetic field with the aid of multiple control currents which add up in the relay coil and generate the shared magnetic field.

In contrast to prior art safety switching devices, the novel safety switching device requires only a single relay coil, which lowers the manufacturing costs, because manufacturing relay coils is relatively expensive. Preferably, the single relay coil comprises a plurality of turns, all of which surround a shared coil core or a yoke which is made from ferrite, in particular. The one relay coil therefore generates a magnetic field which actuates all said relay contacts together when the control current flows through the turns of the one relay coil. However, the one magnetic field actuates in this case two contact groups, which are mechanically decoupled from each other and are therefore movable relative to each other, and therefore the novel safety switching device comprises two separate disconnecting paths despite the one shared relay coil.

In preferred exemplary embodiments, the novel safety switching device comprises only one single relay component which provides all necessary relay contacts and the one relay coil under one shared dust cap, i.e., in one shared component housing. The manufacturing costs for this one relay component are of a similar order of magnitude as the manufacturing costs for one of the two safety relays required so far. Since only one such relay component is required in the novel safety switching device in the preferred exemplary embodiments, however, a substantial cost savings is possible as compared to safety switching devices of the type in question. In addition, the wiring complexity utilized to assemble the novel safety switching device is also reduced, because only one relay component has to be mounted on a circuit board.

The electromagnetic coupling between the one relay coil and the two mechanically separate contact groups, which are movable relative to each other, can be implemented using one or more clapper armatures, rotating armatures, or the like. Clapper armatures typically comprise a pivotably mounted rocker arm which is preloaded into a resting position by means of the spring preload and is pivoted into a working position by the magnetic field which is generated by the control current in the relay coil. The clapper armature may be designed to include a sliding element or can be coupled to a sliding element, and the sliding element moves all coupled (positively driven) relay contacts against the spring tension into their particular working position. If the control current and, therefore, the magnetic field are not present, the relay contacts fall back into their resting position due to the spring tension.

A suitable relay for the novel safety switching device may comprise, in principle, a shared clapper armature for both groups of positively driven relay contacts. The shared clapper armature can actuate, for example, two separate sliding elements which are movable opposite each other. Advantageously, the relay arrangement in the novel safety switching device comprises two armatures, however, wherein one armature actuates one group of positively driven relay contacts in each case, because this provides for a better mechanical decoupling between the two groups of relay contacts.

Rotating armature relays comprise an armature which is rotatably mounted between two yoke ends and can be rotated into a working position via the magnetic field of the relay coil. In some exemplary embodiments, the novel safety switching device may comprise a rotating armature relay, wherein the contact groups, which are mechanically decoupled from each other, can be controlled together by the one rotating armature. Advantageously, the novel safety switching device comprises a relay including two rotating armatures, however, which, in preferred exemplary embodiments, are disposed on a common axis of rotation. Each rotating armature actuates only one contact group in this case, in order to achieve a better mechanical decoupling between the contact groups in this case as well.

In the preferred exemplary embodiments, the relay coil of the novel safety switching device is a coil which has been wound onto the coil core in a uniform manner, i.e., with a constant pitch. In some exemplary embodiments, the relay coil may comprise two or more spaced turn sections on the one coil core, wherein one turn section may be assigned to one group of positively driven relay contacts in each case, in order to achieve a better decoupling of the contact groups. A shared control current advantageously flows through the one relay coil in this case as well.

Overall, the novel safety switching device therefore comprises a relay coil, via which two redundant contact groups are actuated, wherein each of the two contact groups comprises at least two relay contacts which are positively driven with each other, and wherein one of the positively driven relay contacts of the one contact group is arranged electrically in series with one of the positively driven relay contacts of the other contact group in each case. A control current in the one relay coil generates a magnetic field, with the aid of which the two contact groups, which are mechanically decoupled from each other and can therefore be moved separately from each other, can be actuated together. In this case, one relay contact of the first contact group and one further relay contact of the second contact group are arranged in series with one another in each case, in order to form a current path which can be interrupted by the logic part in a two-channel manner via the one relay coil.

The novel safety switching device is therefore function- and connection-compatible with prior art safety switching devices, which utilize two separate safety relays. Manufacturing costs are reduced, however, because only one relay coil is required. The aforementioned object is therefore completely achieved.

In a preferred refinement, the safety switching device comprises a first and a second switching element which are arranged electrically in series with the relay coil and are coupled to the logic part in such a manner that the logic part can interrupt the control current through the relay coil using the first and/or the second switching element. In the preferred exemplary embodiments, the first and the second switching elements are semiconductor switching elements, in particular field effect transistors. In principle, however, the first and/or the second switching element could be other semiconductor switching elements, such as bipolar transistors, or further relay contacts.

This refinement provides for, in a simple way, a two-channel interruption of the one control current for the relay contacts and therefore offers, in a cost-effective way, a single-fault-secure disconnecting path even though a single relay coil is utilized for the actuation of the redundant relay contacts. Since the output side of a safety switching device is particularly critical for the fail-safe disconnecting, the omission of a completely two-channel implementation of the output part in a safety switching device is a highly unusual measure for a safety switching device. Surprisingly, however, it has been shown that the required single fault security can also be achieved with the aid of only one single relay coil in the output part of the safety switching device. The two-channel interruption of the control current with two switching elements arranged in series with the relay coil is a particularly simple and practical implementation.

In yet another refinement, the logic part comprises a first evaluation channel and a second evaluation channel, wherein the first and the second evaluation channels each redundantly control the first and the second switching elements.

In this refinement, each of the two redundant switching elements is itself redundantly controlled, which is a particularly reliable and advantageous implementation, in order to ensure the desired fault protection in the novel safety switching device.

In yet another refinement, the first switching element is situated upstream from the relay coil and the second switching element is situated downstream from the relay coil.

This refinement is particularly advantageous, because it offers two different disconnecting paths at the one relay coil. On the one hand, a disconnecting is possible via the second, downstream switching element in the event of a short circuit of the relay coil to the supply voltage of the safety switching device. Conversely, a current through the relay coil can also be interrupted via the first switching element when the ground potential of the safety switching device is present directly at the relay coil due to a fault. The embodiment therefore provides for a particularly high level of fault protection in a very simple and cost-effective way.

In yet another refinement, the logic part is configured to determine and, in particular, to measure an instantaneous control current through the relay coil. Preferably, the logic part is capable of determining the control current through the relay coil with the aid of at least one A/D converter, i.e., the logic part detects at least one digital numerical value which represents the control current through the relay coil. In preferred exemplary embodiments, the logic part is configured to determine the control current through the relay coil in a two-channel or redundant manner.

This refinement allows real-time monitoring of the control current through the relay coil and advantageously contributes to a particularly high level of fault protection therefore. A redundant, two-channel determination of the control current with the aid of two A/D converters is also advantageous because, in this way, the proper function of each A/D converter can also be monitored by means of a plausibility comparison.

In yet another refinement, the safety switching device comprises a shunt resistor which is situated downstream from the first and the second switching elements. Preferably, the shunt resistor is also situated downstream from the relay coil.

This refinement allows determination of the instantaneous control current through the relay coil in a very simple and cost-effective way. In some preferred exemplary embodiments, the shunt resistor has an electrical resistance in the range between 1 ohm and 10 ohms, in particular 3 ohms, and a maximum of 100 ohms, because a low resistance value minimizes the heat input into the safety switching device for the current measurement.

In yet another refinement, the logic part is configured to maintain the control current through the relay coil at a defined current value.

This refinement is very unusual for the output-side control current of a safety switching device comprising relay contacts, since all that matters, in principle, for a safety switching device are the two states "load is energized" or "load is disconnected". A closed-loop control of the control current in the safety switching device makes it possible to minimize the operating temperature of the safety switching device and therefore contributes to an even greater level of fault protection.

In some exemplary embodiments, the logic part is configured to maintain the control current through the relay coil at the nominal value of the holding current for the relay contacts. This has the advantage that a reliable closing of the relay contacts at a minimal operating temperature of the safety switching device can also ensured when the operating voltage in the region of the technical system fluctuates, which can be the case, for example, with large production machines having powerful motors. In some advantageous embodiments, the logic part is configured to control at least one of the aforementioned switching elements with the aid of pulse width modulation (PWM), in order to maintain the control current through the relay coil at the defined current value. Preferably, the logic part controls the second, downstream switching element with the aid of the pulse width modulation, which is particularly advantageous, when the control current through the relay coil is measured in the region of the second, downstream switching element.

In yet another refinement, the logic part is configured to determine an instantaneous voltage at the relay coil, in order to interrupt, depending thereon, the control current through the relay coil.

In this refinement, the novel safety switching device has voltage monitoring, in particular overvoltage monitoring, at the relay coil. Preferably, the novel safety switching device has the voltage monitoring in addition to the above-described measurement or regulation of the control current. The combination of the two monitorings provides for a particularly high level of fault protection and is possible in a cost-effective manner due to the one relay coil.

In yet another refinement, the relay coil and the first, second, third, and fourth relay contacts are accommodated in a common component housing which is designed to be mounted on a circuit board. In particularly preferred exemplary embodiments, a total of 6, 8 or 10 relay contacts are situated in the common component housing and form two contact groups having 3, 4 or 5 positively driven relay contacts, respectively.

In this refinement, the one relay coil and the aforementioned relay contacts are components of a relay component which can be utilized instead of the previously utilized two safety relays. The component housing surrounds the relay coil, the at least one armature, and the relay contacts, and has, on its outer side, solder and/or plug contacts which allow for mounting on a circuit board in a conventional mounting process. The relay coil and the indicated relay contacts therefore form a novel type of safety relay which allows for a particularly cost-effective manufacturing of the novel safety switching device.

In yet another refinement, the first and the second relay contacts each are designed as normally open contacts, and the third and the fourth relay contacts each are designed as normally closed contacts.

In this refinement, the safety switching device comprises at least one positively-driven normally closed contact in each disconnecting path, which allows monitoring of the normally open contacts before an electrical load is switched on. The positively driven coupling between the normally open contact and the normally closed contact in each disconnecting path makes it possible to monitor the working contacts in a manner that has proven effective for many years and that is compatible with prior art safety switching devices. The safety switching device according to this refinement can therefore be utilized very simply as a cost-effective replacement device for older prior art safety switching devices.

In yet another refinement, the relay coil drives at least one movable armature which is mechanically coupled to the relay contacts, and the output part comprises an optical detector, in particular a light barrier, with the aid of which the logic part can detect at least one armature position of the at least one movable armature. In some preferred exemplary embodiments of this refinement, the first, second, third, and fourth relay contacts each are normally open contacts and the output part functions without positively-driven normally closed contacts.

In this refinement, monitoring of the working contacts takes place with the aid of an optical detector instead of the normally closed contacts utilized with prior art safety switching devices. The refinement allows for a smaller installation space and a lower detection current for monitoring the normally open contacts. The safety switching device according to this refinement can therefore be designed to be smaller and more compact. In addition, this refinement reduces the undesirable bouncing of the relay contacts during the interruption of the load current. The optical detector can advantageously monitor the at least one movable armature or a sliding element which is mechanically connected to the movable armature. In exemplary embodiments in which the safety switching device comprises a separate armature for each contact group, an optical detector advantageously detects all movable armatures together. In some advantageous exemplary embodiments, the armatures each have a passage, wherein the passages in the armature align with each other when the normally open contacts of the contact groups are open. In the case of a light barrier, the light can reach the light receiver only when the passages in the armature at least partially align with each other.

In yet another refinement, the logic part is designed for adjusting the control current depending on the at least one armature position.

In this refinement, the logic part adjusts the control current through the relay coil with consideration for an instantaneous armature position which, in some exemplary embodiments, the logic part can detect with the aid of the optical detector. In other exemplary embodiments, the logic part is configured to determine the instantaneous armature position from the measured current value and/or a temporal change of the measured current value. Advantageously, the logic part increases the control current through the relay coil when an unexpected release of the normally open contacts is detected, for example due to a strong mechanical vibration. The refinement allows for higher availability of the monitored system in a simple and cost-effective manner by way of avoiding or at least reducing erroneous disconnections.

In yet another refinement, the optical detector comprises a light transmitter and a light receiver which are situated outside the shared component housing of the relay component, and the optical detector further comprises an optical waveguide which extends from the light transmitter and/or light receiver to the at least one movable armature.

In this refinement, the light transmitter and the light receiver are situated outside the component housing, for example being fastened externally on the base of the relay component, and are therefore protected against contamination and heat due to contact burn. The service life of the novel safety relay may advantageously be increased.

It is understood that the features mentioned above and which are described below may be used not only in the combination described, but also in other combinations or alone, without leaving the scope of the present invention.

BRIEF DESCRIPTION OF THE DRAWINGS

Exemplary embodiments of the invention are shown in the drawing and are described in greater detail in the following description, wherein.

DESCRIPTION OF PREFERRED EMBODIMENTS

Figure 1:
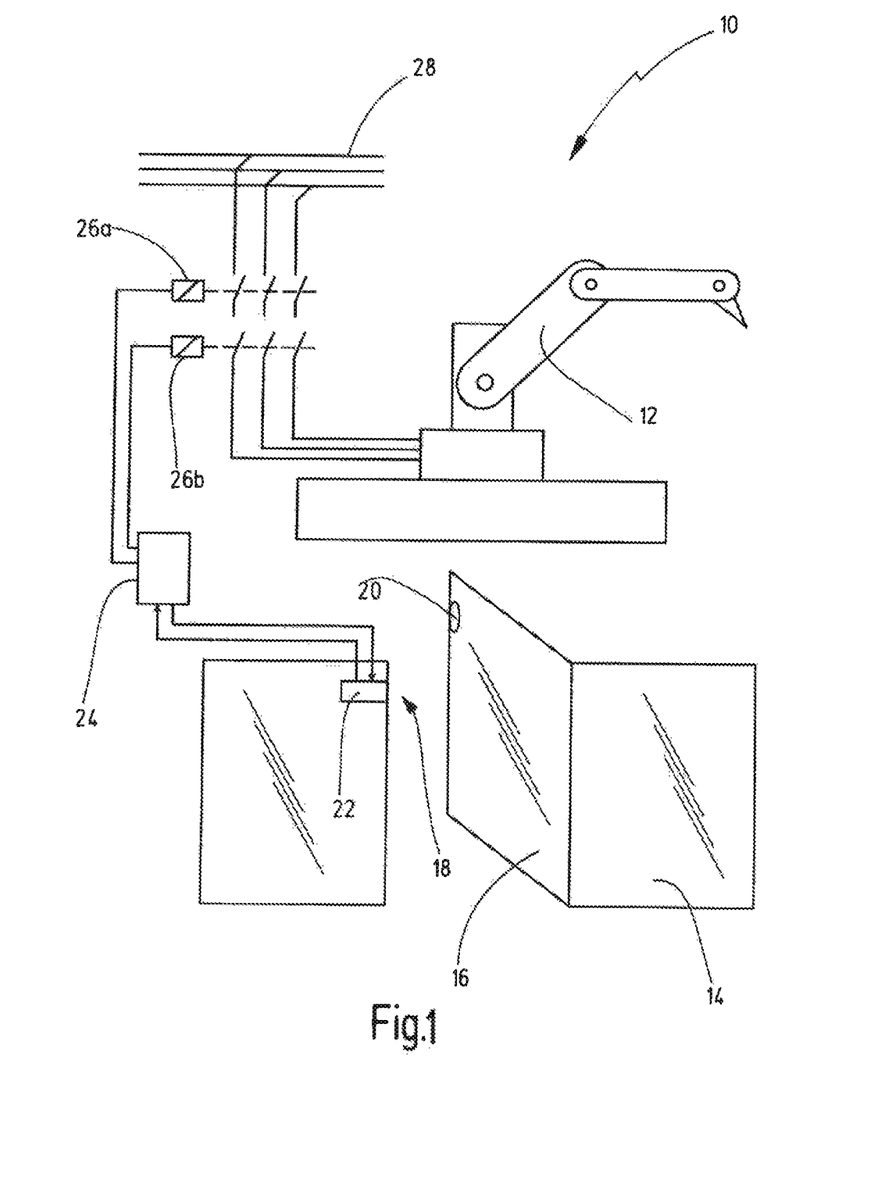
FIG. 1 shows a schematic representation of an exemplary embodiment of the novel safety switching device in conjunction with a robot, the operation of which poses a danger to persons.

In FIG. 1, an arrangement comprising an exemplary embodiment of the novel safety switching device is designated by reference number 10 in its entirety.

The arrangement 10 includes a robot 12 in this case, the movements of which pose a danger to persons who are located in the working space of the robot 12. The robot 12 is shown here as an example of a technical system to be safeguarded. The novel safety switching device may also be utilized for safeguarding systems other than a robot 12, in particular systems that fall under the definition of the EU Directive 2006/42/EC (Machinery Directive). More generally, the novel safety switching device is used for fail-safely disconnecting an electrical load which can be, for example, an electrical drive, a contactor, and/or a solenoid valve in such a system.

Robot 12 is enclosed by a fence 14 comprising a guard door 16, in order to prevent inadvertent entry by a person into the dangerous working zone of robot 12. Guard door 10 is provided with a guard door switch which comprises a door part 20 and a frame part 22. An exemplary embodiment of the novel safety switching device is designated here by reference number 24 and is connected to the frame part 22 of the guard door switch 18 via lines. With the aid of the signals from the guard door switch 18, the safety switching device 24 can monitor whether the guard door 16 is closed or not. In the latter case, robot 12 is to be shut down, which is ensured using safety switching device 24.

On the output side, safety switching device 24 drives two contactors 26a, 26b in this case. Contactors 26a, 26b each comprise a number of working contacts (typically normally open contacts) which are arranged in the power supply path from a power supply 28 to robot 12. If the safety switching device 24 detects, with the aid of the guard door switch 18, that guard door 16 is open, it drives contactors 26a, 26b in such a way that robot 12 is disconnected from power supply 28.

The arrangement 10 is shown in a simplified manner in FIG. 1. Such a device 10 usually comprises not only one guard door including a guard door switch 18, but also a plurality of so-called signaling units and sensors, with the aid of which numerous states of the automated system can be detected. Moreover, the arrangement 10 typically comprises an operational controller which controls the working movements of robot 12 (more generally: the system). The safety switching device 24 is used, in this case, as a supplement to the operational controller (not represented here) for safeguarding the operation of robot 12 to such an extent that accidents due to inattentiveness, component failure, inter alia, are avoided.

When only a few safety functions, such as, for example, monitoring of the guard door and perhaps an emergency stop button, are required in an arrangement 10, safety switching devices having a largely predefined, fixed functional scope are typically used in practice, such as, for example, for monitoring guard door switch 18. Multiple safety functions are then implemented by means of a combination of multiple safety switching devices. So-called safety controllers have proven effective for complex devices, however, the functional scope of which can be established in a highly flexible manner by programming and/or configuring predefined function blocks. Programmable and/or configurable safety controllers typically comprise semiconductor elements for controlling contactors 26 and/or other safety-relevant actuators. The relay technology described in the following is primarily used nowadays in relatively simple safety switching devices having a largely predefined functional scope. Nevertheless, the present invention is not limited to simple safety switching devices of this type and may be similarly exploited in complex safety controllers and/or in so-called I/O assemblies which can be interconnected with a complex safety controller via a bus system. The term "safety switching device" in terms of the present invention therefore includes safety controllers and modular components of safety controllers, which are used for fail-safely disconnecting an electrical load in terms of the aforementioned definition. A compact safety switching device is described in the following as a preferred exemplary embodiment of the invention, however, for the sake of simplicity.

Figure 2:
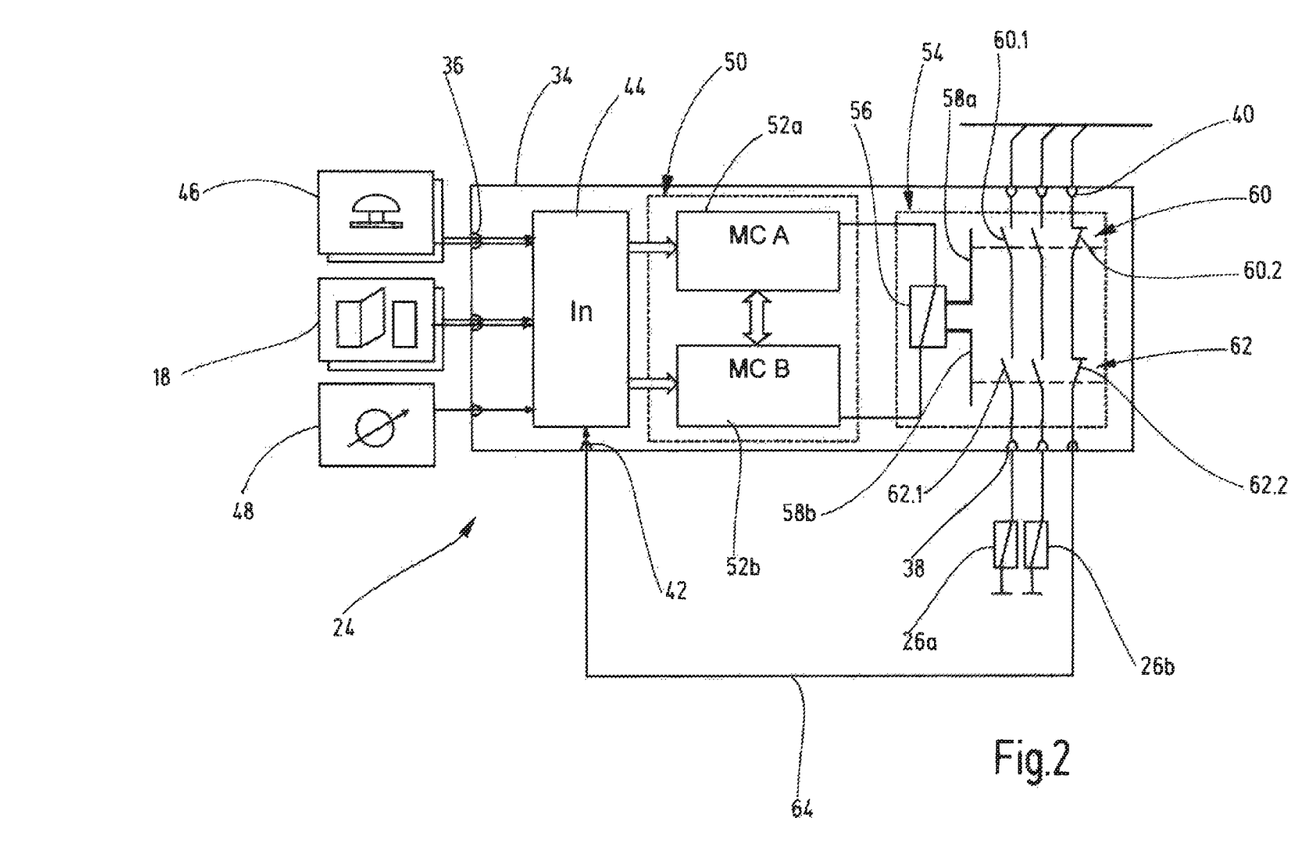
FIG. 2 shows the safety switching device from FIG. 1, according to a preferred exemplary embodiment, including a few details.

According to FIG. 2, safety switching device 24 in this case has a device housing 34 including a plurality of connection terminals 36, 38, 40, 42 which are situated, in a manner known per se, on an outer side of the device housing 34, in order to allow for the connection of safety-relevant signaling units/sensors and safety-relevant actuators. In preferred exemplary embodiments, the connection terminals are spring-loaded terminals or screw-type terminals which allow for a detachable fastening of connection cables.

The safety switching device 24 has an input part 44, to which the input signals are fed from the safety-relevant signaling units/sensors. For example, the electrical signals are routed from the guard door switch 18 via corresponding connection terminals 36 to the input part 44. In addition to guard door switch 18, an emergency stop button 46 and a fail-safe speed sensor 48 are shown here.

The input part 44 receives the input signals from the signaling units/sensors 18, 46, 48 and makes them available to the logic part 50 of the safety switching device 24 for logical processing. The input part 44 can comprise, for example, filter circuits and/or a level adapter. It preprocesses the electrical signals from the signaling units/sensors in such a manner that they can be logically processed by logic part 50.

In this case, the logic part 50 comprises two microcontrollers 52a, 52b which process the input signals redundantly with respect to each other and can monitor each other, which is symbolically shown here with the aid of a double arrow. The redundant microcontrollers 52a, 52b represent a typical implementation of a preferred exemplary embodiment of safety switching device 24. Instead of microcontrollers, microprocessors having associated peripherals, FPGAs, ASICS, and/or other suitable logic components could also be used. A combination of different logic components is also conceivable, in order to implement a fail-safe processing of the input signals. In addition, the input part 44 and/or the logic part 50 may be implemented, in principle, with discrete components, for example with the aid of what is called a 3-contactor circuit.

The safety switching device 24 comprises an output part 54 including a relay coil 56 which is redundantly controlled, in this case, by the two microcontrollers 52a, 52b. In the preferred exemplary embodiments, the relay coil 56 is a component of a safety relay which, as a compact component, forms the output part 54 of the safety switching device 24. Reference number 54 is therefore also utilized for a safety relay in the following.

In this exemplary embodiment, the safety relay 54 comprises two armatures 58a, 58b which are each electromagnetically coupled to the one relay coil 56, and thus a control current through the relay coil 56 can actuate armature 58a as well as armature 58b. Armature 58a is mechanically coupled to a first group 60 of relay contacts 60.1, 60.2. Second armature 58b is mechanically coupled to a second group 62 of relay contacts 62.1, 62.2. The mechanical coupling is designed, in a known way, such that the armature 58a can only actuate all relay contacts 60.1, 60.2 of the first group 60 together. In the same way, armature 58b is coupled to the relay contacts 62.1, 62.2 of the second group 62 in such a way that only all relay contacts 62.1, 62.2 of the second group can be actuated together. However, the relay contacts of the first group 60 and the relay contacts of the second group 62 are mechanically decoupled from each other and so they can generally move separately from each other. The common actuation of all relay contacts 60.1, 60.2, 62.1, 62.2 is achieved in the preferred exemplary embodiments of the safety switching device 24 simply in that a single control current through the one relay coil 56 generates a magnetic field which actuates the first armature 58a as well as the second armature 58b.

The armatures 58a, 58b can be clapper armatures of the type shown here in a simplified manner and which are described, for example, in the publication "Sicherheitsrelais—Elementarrelais mit zwangsgeführten Kontakten" (Safety Relays—Elementary Relays Comprising Positively Driven Contacts; Particular Properties and Their Benefits) mentioned at the outset. Alternatively or additionally, armatures 58a, 58b could be rotating armatures of the type known, for example, as safety relays from Panasonic Electric Works Europa AG. In deviation from the representation in FIG. 2, other exemplary embodiments of the safety switching device 24 may be implemented, in principle, using a single armature 58, wherein the relay contacts of the first group 60 and the relay contacts of the second group 62 are coupled separately to the one armature in this case.

As is apparent in the graphic representation from FIG. 2, one relay contact of the first group 60 is arranged in series with one relay contact of the second group 62 in each case. The particular relay contacts arranged in series with one another form a current path which can be interrupted by the logic part 50 in a two-channel manner, in order to disconnect the contactors 26a, 26b during the opening of the protective door 16.

As further represented in FIG. 2, the safety switching device 24 comprises, in some exemplary embodiments, a first group 60 of relay contacts and a second group 62 of relay contacts, wherein each group includes at least one normally open contact 60.1, 62.1 and at least one normally closed contact 60.2, 62.2. The normally open contacts 60.1, 62.1 arranged in series with one another form a current path to the electrical load (the contactor 26a in this case) which can be interrupted in a two-channel manner with the aid of the safety switching device 24. The normally closed contacts 60.2, 62.2 arranged in series with one another form a monitoring current path, via which a monitoring signal can be fed back to the input part 44 and/or the logic part 50. The monitoring signal 64 makes it possible for the logic part 50 to monitor whether the normally open contacts 60.1, 62.1 are open before the load current path is closed, and thus a disconnecting is still possible (single fault security during disconnecting) during connecting and disconnecting under load, even in the event of fusing or bonding of a normally open contact 60.1, 62.1. In other exemplary embodiments, the safety switching device 24 may comprise a first group 60 of relay contacts and a second group 62 of relay contacts which are designed only as normally open contacts, as is described in the following with reference to FIG. 3. In this case, same reference numbers designate the same elements as before.

Figure 3:
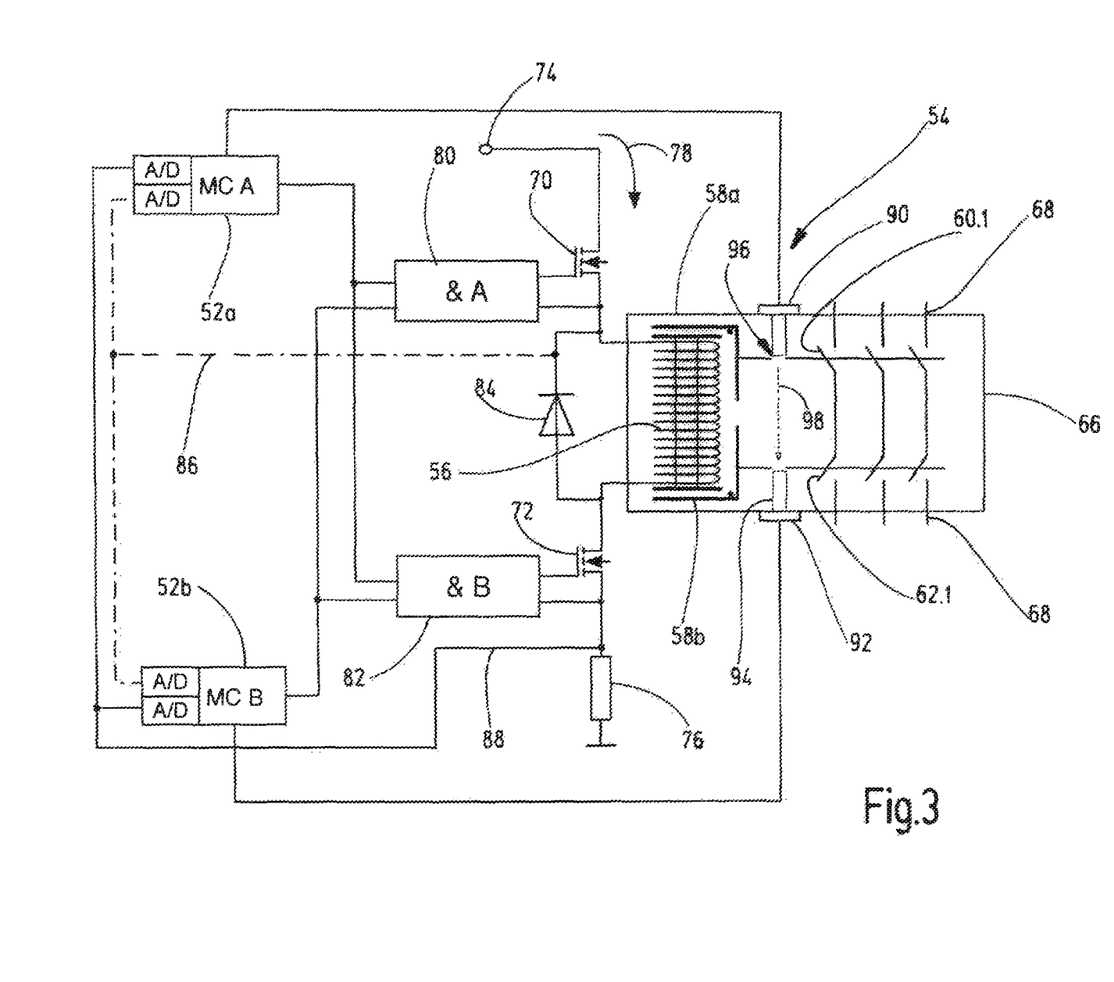
FIG. 3 shows further details of the safety switching device from FIG. 2.

As represented in FIG. 3, relay coil 56, armatures 58a, 58b, and the relay contacts are accommodated together in a component housing 66, on the outer side of which solder and/or plug contacts 68 are situated. In the preferred exemplary embodiments, safety switching device 24 comprises a single safety relay which is fastened, as a compact electromechanical component, on a circuit board (not represented here) via contacts 68. The further electrical components of the safety switching device 24, such as, for example, microcontrollers 52a, 52b, are then connected to relay coil 56 via the conductive tracks on the circuit board (not represented here).

In the exemplary embodiment shown, safety switching device 24 comprises a first switching element 70 and a second switching element 72, each of which is electrically arranged in series with the relay coil 56. In this case, the first switching element 70 is situated upstream from the relay coil 56 and the second switching element 72 is situated downstream therefrom. The series connection of the two switching elements 70, 72 and the relay coil 56 lies between an operating voltage 74 and ground. In the exemplary embodiment shown, a shunt resistor 76 is furthermore situated downstream from the second switching element 72, through which shunt resistor practically the same control current 78 flows as that flowing through the relay coil 56 when the switching elements 70, 72 are closed. The switching elements 70, 72 are field effect transistors in this case, although they could alternatively be other switching elements, preferably being based on semiconductor technology. In preferred exemplary embodiments, each microcontroller 52a, 52b (more generally: each evaluation channel of the logic part 50) controls each of the two switching elements 70, 72. For this purpose, the safety switching device 24 comprises a first driver circuit 80 and a second driver circuit 82 here. The driver circuits 80, 82 combine the output signals of the two microcontrollers 52a, 52b by way of a logical AND operation and generate therefrom a control signal, with the aid of which the switching elements 70, 72 can be selectively made conductive or blocking. Therefore, each microcontroller 52a, 52b can block each of the two switching elements 70, 72 in this case, in order to interrupt the control current 78 through relay coil 56.

In this exemplary embodiment, a freewheeling diode 84 is arranged in parallel to the relay coil 56, in order to allow for a more rapid reduction of the magnetic field induced by the control current 78 during the disconnecting of the electrical load. In this exemplary embodiment, a first tap 86 is provided on the cathode side of the diode 84, which is fed, in this case, to an A/D converter of each of the two microcontrollers 52*a*, 52*b*. Each of the microcontrollers 52*a*, 52*b* can measure the instantaneous voltage at the relay coil 56 via the A/D converters and the tap 86. Moreover, the microcontrollers 52*a*, 52*b* can check, with the aid of the tap 86, whether the switching element 70 switches correctly.

One further tap 88 is provided here between the second switching element 70 and the shunt resistor 76. The tap 88 is fed to an A/D converter of each of the two microcontrollers 52*a*, 52*b* in this case as well. Via the tap 88, the microcontrollers 52*a*, 52*b* can measure the voltage across the shunt resistor 76, which is representative of the control current 78 which flows through the relay coil 56.

It is therefore possible, as an alternative or in addition to the above-described monitoring of the switching element 70, to monitor the switching function of the switching elements 70, 72 by way of the microcontrollers 52*a* and 52*b* indirectly measuring the current via the further tap 88. In preferred exemplary embodiments, the microcontrollers 52*a*, 52*b* are further designed to detect drift errors in the switching elements 70, 72 on the basis of the current measurement.

In further exemplary embodiments (not represented here), the switching elements 70, 72 may both be situated upstream from the one relay coil 56. Moreover, it is possible in some exemplary embodiments that a microcontroller determines the current and the other microcontroller determines the voltage at the relay coil 56. The latter variant is particularly advantageous when the switching elements 70, 72 are both situated upstream from the one relay coil 56.

In preferred exemplary embodiments, at least one of the microcontrollers 52*a*, 52*b* is designed for maintaining the current 78 through relay coil 56 at the nominal holding current of relay 54. It is particularly advantageous when the corresponding microcontroller controls the second switching element 72, for this purpose, with the aid of a pulse width modulation, in order to adjust the mean current flow to the level of the nominal holding current of the relay 54.

As represented in FIG. 3, in some exemplary embodiments, relay 54 comprises only normally open contacts 60.1, 62.1. Instead of the positively-driven normally closed contacts 60.2, 62.2 represented in FIG. 2, the corresponding safety switching device comprises an optical detector which is designed as a fork light barrier in this case. The optical detector comprises a light transmitter 90, for example in the form of a light-emitting diode, and a light receiver 92. In some advantageous exemplary embodiments, the light transmitter 90 and the light receiver 92 are arranged outside of housing 66 of relay 54. Situated in the interior of the relay housing 66 is an optical fiber 94 which brings the light from the light transmitter 90 specifically to a point at which the armatures 58*a*, 58*b* or the sliding elements actuated with the armatures each comprise a passage 96 which is positioned in such a way that the light 98 can reach the light receiver 92 only when the normally open contacts in both disconnecting paths are open. Due to the insulation clearances to be maintained and given an equal number of normally open contacts, the safety relay 54 comprising the optical detector can be implemented in a more compact manner than is the case for a comparable safety relay comprising positively-driven normally closed contacts.

In some advantageous exemplary embodiments, the logic part 50 is designed for increasing the control current 78 through the relay coil 56 specifically when the light intensity on the light receiver 92 decreases, while the normally open contacts are operatively closed, in order to prevent an inadvertent release of the relay contacts, for example in the case of strong vibrations. Alternatively or additionally, the logic part in some exemplary embodiments may be designed for determining the armature position on the basis of the control current (in particular on the basis of the particular instantaneous value of the control current and a temporal change of the instantaneous value) and, depending thereon, for specifically increasing the control current 78 through the relay coil 56, in order to prevent an undesireable release of the relay contacts.

In order to disconnect the electrical load, it suffices that the logic part 50 reduces the control current 78 through the relay coil 56 to a value below the nominal holding current. Preferably, the logic part 50 completely interrupts the control current 78. In this case, the normally open contacts of the safely relay 54 open, due to the inherent spring preload. Since the two groups of positively driven relay contacts are mechanically decoupled and can move separately from each other, the current path to the electrical load can be opened even when one of the normally open contacts is stuck due to fusing, bonding, or the like. Due to the monitoring of the normally open contacts with the aid of the positively-driven normally closed contacts (FIG. 2) or with the aid of the optical detector 90, 92 (FIG. 3), the logic part 50 can detect such a component failure before the electrical load is switched back on.

Furthermore, logic part 50 is preferably designed for carrying out brief disconnecting tests of the switching elements 70, 72, in order to repeatedly test the disconnect capability of the switching elements 70, 72 during on-going operation of the safety switching device 24. The duration of the disconnecting tests, i.e., the duration of the interruption of the control current 78, is advantageously selected to be shorter than the release time of the relay 54, and so the current path to the load is not also interrupted during a disconnecting test due to the inertia of the relay 54. The disconnect capability of the switching elements 70, 72 can be advantageously checked with the aid of the shunt resistor 76 and the tap 88, because the control current through the relay coil must drop to a value close to zero during the opening of a switching element 70, 72. Due to measuring errors of the A/D converters and/or a reverse current through the semiconductor switching elements 70, 72, the measured value can also be slightly greater than zero when switching elements 70, 72 function correctly.

In the preferred exemplary embodiments, the logic part 50 also determines the level of the control current 78 while the switching elements 70, 72 are conductive. Therefore, the logic part 50 can also check proper performance of the A/D converters, since, in this case, the A/D converters must deliver other measured values than is the case when control current 78 is disconnected.

Figure 4:
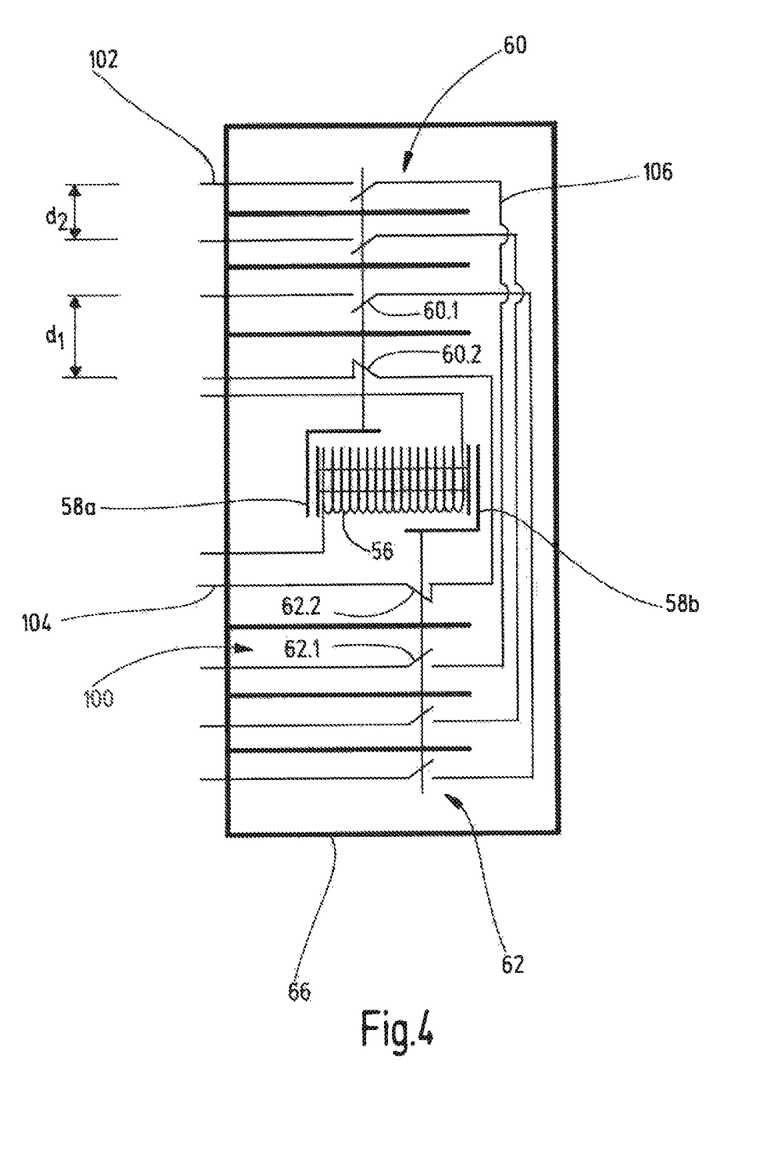
FIG. 4 shows a preferred exemplary embodiment of a relay component which accommodates a single relay coil and two redundant contact groups, each of which is positively driven.

FIG. 4 shows a preferred exemplary embodiment of a relay component comprising a component housing 66 which accommodates the common relay coil 56 and two redundant contact groups 60 and 62. As is apparent here, relay coil 56 is spatially arranged between the two contact groups 60 and 62. Preferably, although not necessarily, relay coil 56 and the relay contacts of the two contact groups 60 and 62 lie in a common plane. In this case, relay coil 56 actuates two armatures 58*a*, 58*b* which can be tilted opposite one another and which are situated on opposite ends of the relay coil 56. In the representation in FIG. 4, armature 58*a* displaces the relay contacts of the first contact group 60 in a first direction (upward in this case), while armature 58*b* displaces the relay contacts of the second contact group 62 in a second direction (downward in this case). Preferably, the first direction is rotated by 180° with respect to the second direction. Such a spatial arrangement is highly compact and also has the advantage that the relay contacts of the two redundant contact groups are moved in opposite directions, which avoids an unintentional closing of the current paths due to vibrations.

The relay component according to FIG. 4 comprises a total of 8 contacts which are divided into two contact groups 60, 62. In other preferred exemplary embodiments, the relay component 10 comprises contacts which are divided into two groups of 5 contacts each. In this case, each contact group 60, 62 comprises three positively-driven normally open contacts 60.1 and 62.1, respectively, and one positive-driven, normally closed contact 60.2 and 62.2, respectively. As is apparent in FIG. 4, the lateral distance d1 of the normally closed contact 60.2 from the adjacent normally open contact 60.1 is greater than the lateral distance d2 between two adjacent normally open contacts. This is advantageous so that higher currents and voltages can be switched via the normally open contacts than is possible via the normally closed contact of a group, without the fault protection of the relay component being adversely affected with respect to the read-back of the contact position with the aid of the normally closed contact. Advantageously, each contact is also situated in a separate chamber 100, in order to further increase insulation between the contact paths.

Moreover, it is advantageous in this case that the electrical connection between the normally open contacts 60.1, 62.1, each of which is arranged in series, and the electrical connection between the two normally closed contacts 60.2, 62.2, which are arranged in series, is implemented within the component housing, and so the relay component for each switched current path comprises only two connections 102, 104. In the preferred exemplary embodiment, the series connection between two redundant contacts 60.1, 62.1 is implemented with the aid of conductive metal parts 106.

Moreover, all connections of the relay component in this advantageous exemplary embodiment are routed outward on one side of the component housing 66, and so the relay component can be easily mounted and soldered in the safety switching device 24.

What is claimed is:

1. A safety switching device for fail-safely disconnecting an electrical load, comprising:
    an input part for receiving at least one safety-relevant input signal,
    a logic part connected to the input part for processing the at least one safety-relevant input signal, and
    an output part which comprises a relay coil and a first relay contact, a second relay contact, a third relay contact, and a fourth relay contact,
    wherein the first and the second relay contacts are arranged electrically in series with one another,
    wherein the third and the fourth relay contacts are arranged electrically in series with one another,
    wherein the first and the third relay contacts are mechanically coupled to each other so as to form a first group of positively driven relay contacts,
    wherein the second and the fourth relay contacts are mechanically coupled to each other so as to form a second group of positively driven relay contacts,
    wherein the first and the third relay contacts can move mechanically separately from the second and the fourth relay contacts,
    wherein the logic part is connected to the output part and redundantly controls the first group of positively driven relay contacts and the second group of positively driven relay contacts in order to selectively allow, or to interrupt in a fail-safe manner, a current flow to the electrical load, in response to the at least one safety-relevant input signal, and
    wherein the relay coil comprises a single relay coil that is electromagnetically coupled to the first group and to the second group of positively driven relay contacts so that the logic part can control the first relay contact, the second relay contact, the third relay contact, and the fourth relay contact together via the single relay coil.

2. The safety switching device of claim 1, further comprising a first switching element and a second switching element which are arranged electrically in series with the single relay coil and are coupled to the logic part so that the logic part can interrupt a control current through the single relay coil using at least one of the first and the second switching element.

3. The safety switching device of claim 2, wherein the logic part comprises a first evaluation channel and a second evaluation channel, wherein the first and the second evaluation channels each redundantly control the first and the second switching elements.

4. The safety switching device of claim 2, wherein the first switching element is arranged upstream and the second switching element is arranged downstream from the single relay coil.

5. The safety switching device of claim 2, further comprising a shunt resistor which is situated downstream from the first and the second switching elements.

6. The safety switching device of claim 1, wherein the logic part is configured to determine an instantaneous control current through the single relay coil.

7. The safety switching device of claim 1, wherein the logic part is configured to maintain a control current through the single relay coil at a defined current value.

8. The safety switching device of claim 1, wherein the logic part is configured to determine an instantaneous voltage at the relay coil and to interrupt, depending thereon, a control current through the single relay coil.

9. The safety switching device of claim 1, further comprising a component housing wherein the single relay coil and the first, the second, the third, and the fourth relay contacts all are accommodated, said component housing being mounted on a circuit board.

10. The safety switching device of claim 1, wherein the first and second relay contacts each are designed as normally open contacts, and wherein the third and the fourth relay contacts each are designed as normally closed contacts.

11. The safety switching device of claim 1, wherein the single relay coil drives at least one movable armature coupled to the relay contacts, and wherein the output part comprises an optical detector with the aid of which the logic part can detect at least one armature position of the at least one movable armature.

12. The safety switching device of claim 11, wherein the optical detector comprises a light transmitter, a light receiver and an optical waveguide which extends from at least one of the light transmitter and the light receiver to the at least one movable armature.

13. The safety switching device of claim 1, wherein the single relay coil drives at least one movable armature which is coupled to the relay contacts, and the logic part is configured to adjust a control current through the relay coil depending on an armature position of the at least one movable armature.

14. The safety switching device of claim 1, wherein the single relay coil is spatially arranged between the first group of positively driven relay contacts and the second group of positively driven relay contacts.

15. A safety switching device relay component, comprising:
   a relay coil,
   a first relay contact, a second relay contact, a third relay contact, and a fourth relay contact, and
   a component housing, in which the relay coil and the first relay contact, the second relay contact, the third relay contact and the fourth relay contact are accommodated,
   wherein the first and the second relay contacts are arranged electrically in series with one another,
   wherein the third and the fourth relay contacts are arranged electrically in series with one another,
   wherein the first and the third relay contacts are mechanically coupled to each other so as to form a first group of positively driven relay contacts,
   wherein the second and the fourth relay contacts are mechanically coupled to each other so as to form a second group of positively driven relay contacts,
   wherein the first and the third relay contacts can move mechanically separately from the second and the fourth relay contacts, and
   wherein the relay coil is electromagnetically coupled to the first group of positively driven relay contacts and to the second group of positively driven relay contacts so that a control current in the relay coil can control the first relay contact, the second relay contact, the third relay contact, and the fourth relay contact together.

* * * * *

UNITED STATES PATENT AND TRADEMARK OFFICE
CERTIFICATE OF CORRECTION

PATENT NO. : 10,460,895 B2
APPLICATION NO. : 15/708343
DATED : October 29, 2019
INVENTOR(S) : Juergen Pullmann et al.

Page 1 of 1

It is certified that error appears in the above-identified patent and that said Letters Patent is hereby corrected as shown below:

On the Title Page

Inventors item (72) Line 4 delete "Antonio" and insert --Antonino--

Signed and Sealed this
Twenty-eighth Day of January, 2020

Andrei Iancu
*Director of the United States Patent and Trademark Office*